United States Patent [19]

Saldin et al.

[11] Patent Number: 5,200,618
[45] Date of Patent: Apr. 6, 1993

[54] METHOD AND APPARATUS FOR ATOMIC IMAGING

[75] Inventors: Dilano K. Saldin, Milwaukee, Wis.; Pedro L. de Andres Rodriquez, Madrid, Spain

[73] Assignee: University of Wisconsin - Milwaukee, Milwaukee, Wis.

[21] Appl. No.: 490,847

[22] Filed: Mar. 9, 1990

[51] Int. Cl.$^5$ ............................................. H01J 37/26
[52] U.S. Cl. ................................. 250/307; 250/306; 359/1
[58] Field of Search ................... 378/36; 250/306, 307, 250/310, 311, 305; 350/3.6, 3.61, 3.64, 3.65, 3.66, 3.82, 3.85, 162.11; 364/827; 359/1, 9, 29, 35, 558, 577, 900

[56] References Cited

U.S. PATENT DOCUMENTS 4,532,422 7/1985 Nomura et al. .................... 250/306
4,935,625 6/1990 Hasegawa et al. .................. 250/306

OTHER PUBLICATIONS

Theeten, J. B. "Analysis of a surface crystallography of a solid: LEED and RHEED techniques" *Acta Electronica*, vol. 18, No. 1 1975 pp. 39-45.
Saldin, D. K. and de Andres, P. L., "Holographic LEED" *Physical Review Letters* vol. 64, No. 11 12 Mar. 1990 pp. 1270-1273.
Barton, John J. "Photoelectron Holography" *Physical Review Letters* vol. 61, No. 12 19 Sep. 1988 pp. 1356-1359.
K. Heinz et al., "Measurement of Diffuse Leed Intensities," *Surface Science* 173 (1986) pp. 366-378.
J. B. Pendry et al., "SEXAFS Without X-Rays", *Surface Science* 145 (1984) pp. 33-47, FFT in Two or More Dimensions, Fourier Transform Spectral Methods.
A. Szöke, "X-Ray And Electron Holography Using A Local Referrence Beam," American Institute of Physics (1986).
"Improvement of the Spherical Mirror Analyzer," H. Daimon and S. Ino, *Rev. Sci. Instrum.* 61 (1), Jan. 1990 pp. 57-60.
Reliability of Diffuse LEED Intensity Measurements, Starke, et al., *Surface Science*, 216 (1989) pp. 325-342.
"New Display-Type Analyzer for the Energy and the Angular Distribution of Charged Particles", H. Daimon, *Rev. Sci. Instrum.* 59 (4), Apr. 1988 pp. 545-549.
"SEXAFS Without X-Rays", J. B. Pendry and D. K. Saldin, *Surface Science*, 145 (1984) pp. 33-47.

*Primary Examiner*—Bruce Y. Arnold
*Assistant Examiner*—David R. Parsons
*Attorney, Agent, or Firm*—Foley & Lardner

[57] ABSTRACT

A method and apparatus for three dimensional imaging of the atomic environment of disordered adsorbate atoms are disclosed. The method includes detecting and measuring the intensity of a diffuse low energy electron diffraction pattern formed by directing a beam of low energy electrons against the surface of a crystal. Data corresponding to reconstructed amplitudes of a wave form is generated by operating on the intensity data. The data corresponding to the reconstructed amplitudes is capable of being displayed as a three dimensional image of an adsorbate atom. The apparatus includes a source of a beam of low energy electrons and a detector for detecting the intensity distribution of a DLEED pattern formed at the detector when the beam of low energy electrons is directed onto the surface of a crystal. A device responsive to the intensity distribution generates a signal corresponding to the distribution which represents a reconstructed amplitude of a wave form and is capable of being converted into a three dimensional image of the atomic environment of an adsorbate atom on the crystal surface.

20 Claims, 5 Drawing Sheets

METHOD AND APPARATUS FOR ATOMIC IMAGING

This invention was made with government support under contracts awarded by the Department of Energy. The government has certain rights in this invention.

FIELD OF THE INVENTION

This invention pertains generally to a method and apparatus for surface structure determination and in particular to a method and apparatus for surface structure determination from diffuse low energy electron diffraction data.

BACKGROUND OF THE INVENTION

The information pertaining to the relative positions of adsorbed atoms on a crystal surface is important in understanding the chemical and physical properties of a crystalline structure. Techniques of gathering information concerning the surface structure include photoelectron diffraction/holography, low energy electron diffraction (LEED) and diffuse LEED (DLEED).

It has been suggested that holograms an holographic techniques (the creation of a three dimensional image from an interference pattern) will be useful in the determination of surface structure. A hologram is a record of an interference pattern, which, when properly illuminated, forms a three dimensional image of the object originally used to create the interference pattern. Thus, assuming that it is possible to create one, a hologram of a surface may be used to determine the relative positions of an adsorbed atom and the surrounding substrate atoms.

A hologram of an object is created by simultaneously irradiating photographic film and the object with coherent light. Light that is reflected off of the object, called the object wave, travels to the film and forms an interference pattern with the mutually coherent light that travels directly to the film (called the reference wave). When the recorded interference pattern, or hologram, is illuminated by a coherent reconstructing wave identical to the reference wave, a portion of the transmitted light (wave pattern) is identical to the light (wave pattern) that was reflected off of the object and used to create the hologram. Since this part of the transmitted wave pattern is identical to the original wave pattern, an observer at any location sees a three dimensional image o the object, just as the original object would have been seen from that location.

Electron holography is similar to conventional holography, except that the waves used to create the interference pattern are electrons. As is well known to those skilled in the art, electrons that are monochromatic (i.e electrons that have the same energy), and that travel in the same direction (i.e. parallel to one another) may be treated as coherent waves according to theory of quantum mechanics. As the electrons become less monochromatic and/or the direction of travel of individual electrons diverges, the electron beam becomes less coherent. Thus, when electrons having an appropriate uniformity of energy and direction of travel to be considered coherent waves over the distance travelled from the object to the holographic film are utilized, a recorded interference pattern between an electron reference wave and an electron object wave form a hologram. The hologram, when illuminated by a reconstructing electron wave identical to the reference wave, should produce a three dimensional image.

The use of electron holography to gather information concerning surface structure promises to be a great advance in the art. It has been suggested, for example, that an electron hologram can be created by recording the intensity of an interference pattern formed by electrons which are emitted from an adsorbed atom, and travel to the film directly from the adsorbed atom (the reference wave), or after scattering off of one or more nearby substrate atoms (the object wave). Then, rather than physically illuminating the hologram to reconstruct the image, data corresponding to the reconstructed intensity is generated by multiplying the recorded data by a function representing the intensity of a reconstructing wave, i.e., "mathematically" illuminating the hologram to reconstruct a real image. The image intensity at points off the hologram, i.e. a reconstructed image, may then be appropriately determined via a computer using certain mathematical techniques.

One method of using holographic techniques to determine surface structure is set forth in *Photoelectron Holography*, Vol. 61, No. 12, Phys. Rev. Letters, Sep. 19, 1988, by John Barton, which proposed to interpret photoelectron (PhD) data, collected on a portion of a spherical surface centered about a crystal having adsorbed atoms, as a photoelectron hologram. It was suggested that the photoelectron data may be normalized by subtracting from each intensity data point the intensity of the reference wave, and then dividing this difference by the square root of the intensity of the reference wave. While the prior art does not explain how the magnitude of the reference wave is obtained, it is nonetheless required that it be known to perform the normalization. Next, the normalized data, which corresponds to the intensity of a hologram (film), is then multiplied by a function representing a reconstructing wave, which is the conjugate of the reference wave, in this case a converging spherical wave. The resultant data corresponds to the transmitted intensity of an illuminating wave. The intensity at points off of the hologram (the spherical surface) is calculated using a mathematical technique called the Helmholtz-Kirchoff integral.

The Helmholtz-Kirchoff integral is a well known technique of determining the intensity of light in three dimensions given the intensity on a surface, and is particularly useful in PhD applications. According to the Helmholtz-Kirchoff integral, each point on the surface is treated as a point source of light, and a mathematical expression for the intensity in three dimensions due to each individual point source is determined. A mathematical expression for the total intensity in three dimensions is simply the sum of the intensities due to the point sources, and may be found by integrating the function representing the intensity due to the individual point sources over the surface (i.e. the point sources). The Helmholtz-Kirchoff integral, when applied to PhD holographic data, is in the form of a double Fourier integral, and may be solved numerically using a fast Fourier transform.

Generating and collecting PhD data, however, requires the use of a synchrotron or other finely tuned source of x-rays to cause the adsorbed atom to emit the electrons. Such a source represents a very expensive piece of equipment found only in a handful of central radiation facilities.

A second method of obtaining surface structure information, which does not require a central radiation facility, is a technique of using low energy electrons to form a diffraction pattern (LEED). LEED involves scattering approximately 20–500 eV electrons off of a crystalline structure, thereby forming a diffraction pattern comprised of Bragg spots (i.e., concentrated high intensity areas) with low intensity areas between. The low energy ensures that the electrons penetrate only a few atomic layers of the substrate.

Experiments involving LEED have been used to determine surface structure. For example, using LEED with crystals assumed to have perfect order (i.e. no adsorbed atoms with the crystal being periodic in all directions), the relative intensities of the various Bragg beams is measured, from which surface structure information is calculated. When partial disorder is assumed, i.e., when the surface is periodic in at least one direction and non-periodic in at least one direction, the disorder is reflected in and calculated from the intensity distributions within a Bragg beam (beam profiles).

Other prior art methods utilize diffuse LEE (DLEED) intensities (the intensities between Bragg beams) to determine surface structure of crystals having no long range order, such as a crystal having adsorbed atoms located randomly throughout the surface, though with locally identical environments, as is often the case. For example, *Measurement of Diffuse LEED Intensities,* Surface Science Vol. 173, No. 2-3, pp 366-378, Heinz et al., describes a method to determine the local environment of the adsorbed atoms. Such method includes the repetitive measurement of diffuse LEED intensities from crystals having adsorbed atoms and then calculating a smoothed spatial diffuse intensity distribution. The experimentally obtained distribution is then compared to computer generated distributions based on model crystal surface structures When a computer generated distribution corresponds closely to the experimentally obtained distribution the conclusion is drawn that the surface structure of the experimental crystal is closely related to that model surface structure.

One overwhelming disadvantage of the prior art DLEED technique is that generation of the theoretical data is too time consuming to be performed concurrently with the experiment, but rather requires hours of super computer CPU time. The significant time involved in making the calculations and high cost of using super computer time presently makes it expensive and inefficient to use DLEED for gathering information concerning surface structure of crystalline material.

Accordingly, a practical and inexpensive method and apparatus of determining the surface structure of disordered adsorbate atoms on a crystal surface which is capable of conveying the structure as the experiment is being performed is highly desirable. Furthermore, such a system would preferably be one which utilizes a source of electrons readily available in most laboratories

SUMMARY OF THE INVENTION

A method of three-dimensional imaging of the atomic environment of disordered adsorbate atoms in accordance with one embodiment of the present invention comprises the initial step of forming a diffuse low energy electron diffraction pattern resulting from the interference of waves emanating from a surface of a crystal containing disordered adsorbate atoms when a beam of low energy electrons is directed against the surface. The intensity of the distribution of the pattern is then detected and data corresponding to the intensity distribution is generated. Data corresponding to reconstructed amplitudes of a wave form is generated by operating upon the intensity data by a function representing a reconstructing wave. Data corresponding to an integral of the reconstructed waveform is generated which is capable of being displayed as a three-dimensional image of an adsorbate atom.

In accordance with still another embodiment of the present invention, an apparatus for the reconstruction of a holographic image of disordered adsorbate atoms is provided comprising a source for generating a beam of low energy electrons and directing the beam onto a crystalline surface having disordered adsorbate atoms. Also included is a detector for detecting the intensity distribution of a diffraction pattern and a device responsive to the intensity distribution for generating a first information signal corresponding to the distribution and representing a reconstructed amplitude of a waveform. Still another device responsive to the first signal for generating a second signal capable of being converted into a three-dimensional image of the atomic environment of an adsorbate atom is provided.

BRIEF DESCRIPTION OF THE DRAWING

FIG. 2A is a photograph of a section of a first selected plane of a holographic image of an adsorbed atom surrounded by substrate atoms, generated, from a computer generated DLEED pattern, according to the present invention.

DETAILED DESCRIPTION OF THE PREFERRED EXEMPLARY EMBODIMENT

The present invention involves both a method and apparatus for determining the relative positions of adsorbed atoms on a crystal surface from data obtained using DLEED techniques. According to the present invention, DLEED intensity data are recorded and treated as a hologram Holographic image intensity data are generated from the hologram by a system which mimics the physical steps ordinarily necessary to create an actual image of the hologram. Selected planes of the generated image may be viewed by displaying data corresponding to a single plane on a television monitor or similar device.

Figure 1:
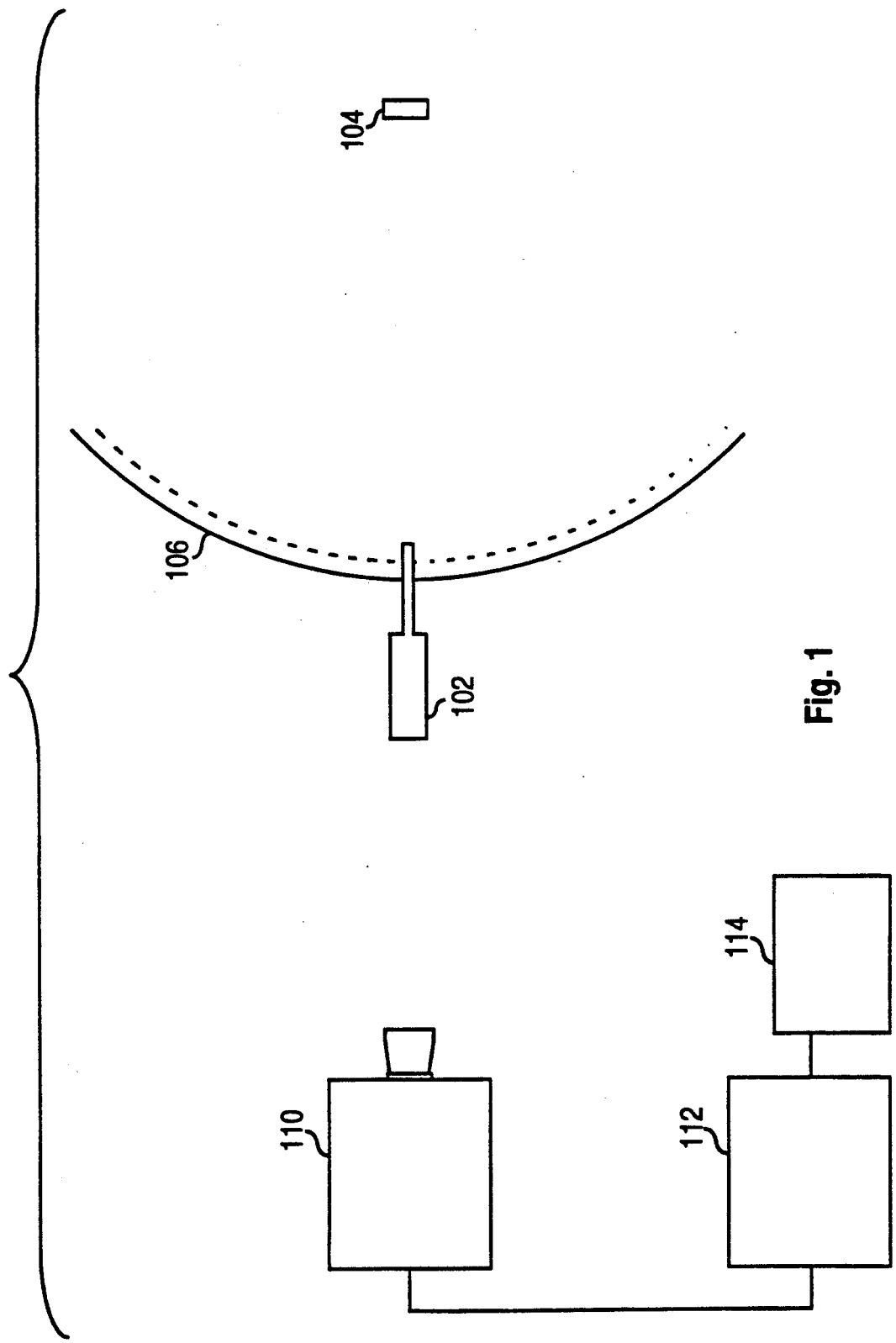
FIG. 1 depicts a schematic of an apparatus for determining the surface structure of adsorbate atoms according to the present invention.

The equipment appropriate for generating and collecting DLEED data for the present invention resembles, to some extent, equipment employed by conventional DLEED or LEED techniques used for gathering information about crystal surface structure, and includes, as shown in FIG. 1, an electron source 102 for directing electrons to a crystal 104, a detector 106 for detecting the intensity of scattered electrons, a camera 110 for converting the intensity of the diffraction pattern of the electrons detected by detector 106 into electronic data, a computer 112 for storing and manipulating the data and a video display unit 114 for displaying a section of a selected plane of the resultant holographic image as the experiment is being conducted that is, as a continuous, real-time image of the crystal delayed by the time needed to compute the image. As in conventional LEED techniques, the data must be gathered in vacuum conditions.

To create the hologram, the electrons, which are incident the surface of crystal 104, must be sufficiently monochromatic and collinear to be considered sufficiently coherent. Thus, electron source 102, suitably an electron gun in the preferred exemplary embodiment, must be capable of emitting substantially monochromatic electrons and must collimate the electron beam such that the electrons travel from electron source 102 to the surface of crystal target 104 along substantially parallel paths, such as a plurality of paths 202A, 203A, 204A, 206A and 207A, shown in FIG. 2. Using techniques well known in the art it is possible to provide an electron beam having an energy between 20 and 500 eV that may be considered coherent waves at the surface of the crystal over distances on the order of 100 angstroms. It has been found that electrons having energies between about 300 and 500 eV are particularly advantageous when practicing the present invention.

The electrons travel to and impinge upon, the surface of crystal 104, where, due to their relatively low energy (20-500 eV), they generally penetrate at most two or three atomic layers of the crystal and are diffracted to form an interference pattern at detector 106.

The interference pattern (the hologram) formed at detector 106 is converted into electronic data by camera 110. When the electrons strike detector 106, which may, for example, be spherical in shape, detector 106 emits light, at the locations electrons impinge upon detector 106, of an intensity proportional to the number of electrons impinging at each location. Camera 110 converts the intensity pattern of the light emitted by detector 106 into electronic data. Computer 112 is suitably programmed to store and mathematically manipulate the electronic data which corresponds to the interference pattern intensity.

Figure 2:
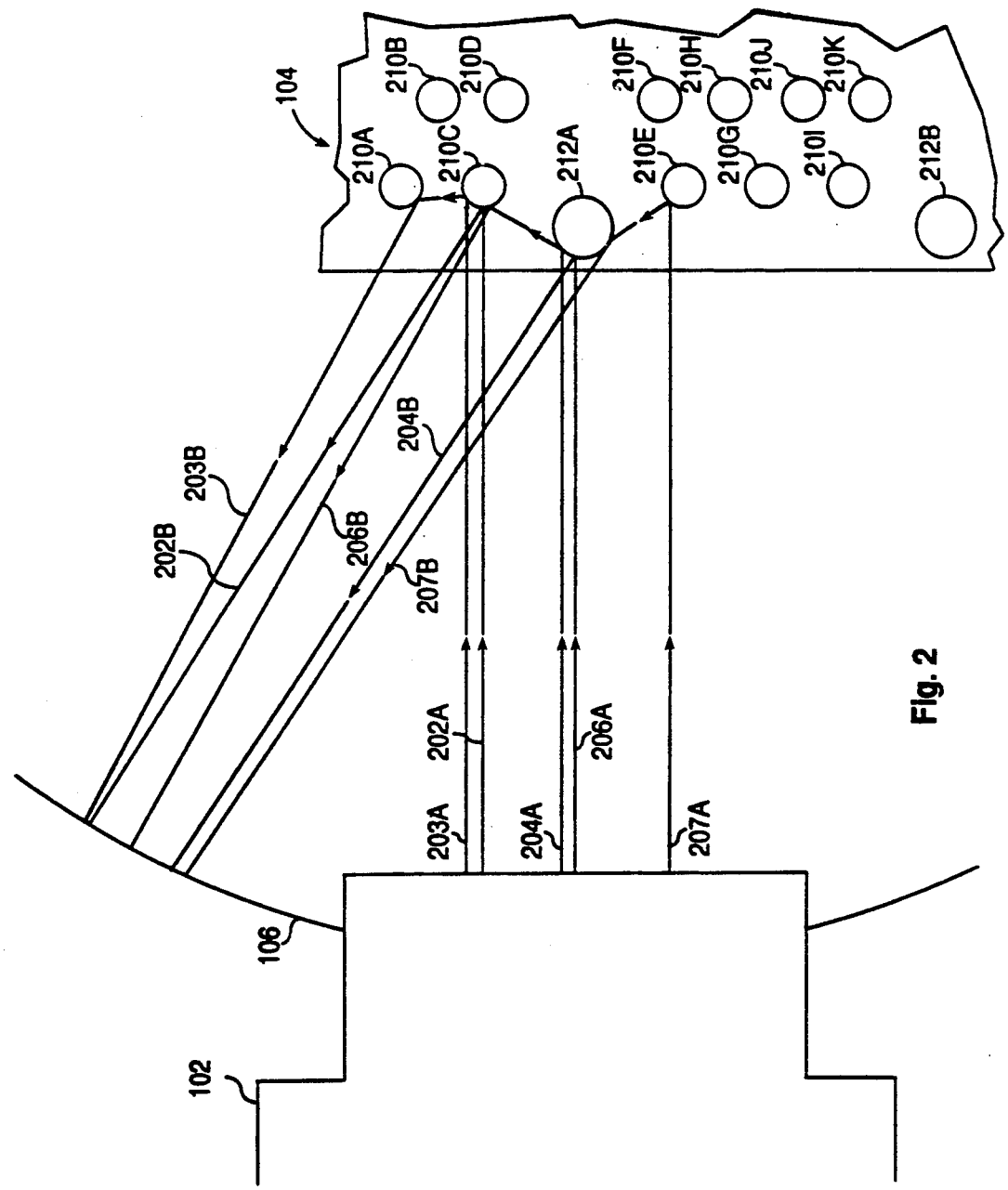
FIG. 2 shows representative paths of electrons that are scattered off of a crystal surface having adsorbed atoms surrounded by substrate atoms.
Figure 2:
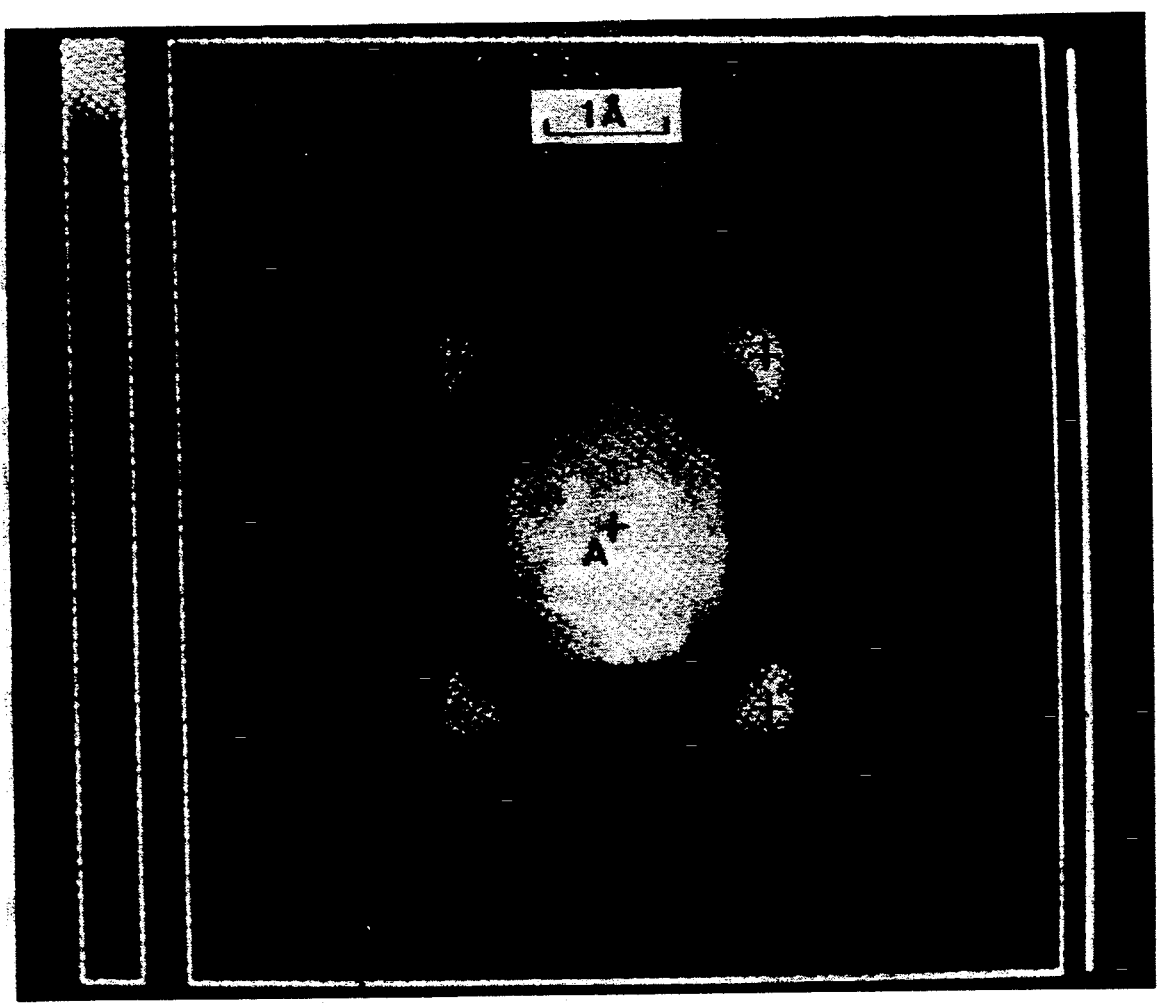

Referring to FIG. 2, the surface of crystal 104 is shown enlarged relative to electron source 102, and is comprised of substrate atoms, representatively shown by 210A-K, and collectively referred to as 210, and adsorbed atoms, representatively shown by 212A-B, collectively referred to as 212. Adsorbed atoms 212, in the early stages of adsorption, interact primarily with substrate atoms 210, rather than each other, forming a lattice gas. The lattice gas will have identical local substrate environment, because each adsorbed atom 212 interacts with substrate atoms 210 in the same manner, but will be devoid of long range order because the position of each adsorbed atom 212 relative to other adsorbed atoms 212 is random. In other words, each adsorbed atom 212 will be surrounded by local substrate atoms 210 in identical relative positions, but adsorbed atoms 212, relative to other adsorbed atoms 212, are randomly located on the crystal surface.

The atoms on the surface of crystal 104 act as a beam splitter. The incoming electron beam is "split" into the following four categories of outgoing beams: 1) beams which scatter off of only substrate atoms 210 (paths 202A-B and 203A-B, for example); 2) beams which scatter off of a combination of substrate and adsorbed atoms, but scatter off of an adsorbed atom 212 last (path 207A-B, for example); 3) beams which scatter off of only adsorbed atoms 212 (path 206A-B, for example); and 4) beams which scatter off of a combination of substrate and adsorbed atoms, but scatter off of a substrate atom 210 last (path 204A-B, for example). These four categories of beams (or waves) then form an interference pattern at detector 106.

Only the portions of the interference pattern that contain information about adsorbed atoms 212 are used to create the holographic image of an adsorbed atom 212 and the surrounding substrate atoms 210. The first category of beams described above, Bragg beams, forms the Bragg spots (high intensity spots in the diffraction pattern) and are used in conventional LEED. Since the Bragg beams do not interact with adsorbed atoms 212 they contain no information regarding adsorbed atoms 212 and are ignored according to the present invention. In fact, DLEED, as the name suggests, involves the use of diffuse diffraction data only (low intensity areas between Bragg beams), which is formed by the interference of the second, third and fourth categories of beams described above. Electrons which scatter off of adsorbed atoms 212 last (the second and third categories of beams described above) form the reference wave, while electrons which are back scattered and scatter off of substrate atoms 210 last form the object wave. It is the interference between the reference and object waves which forms the hologram.

From the DLEED interference pattern, which was formed by scattering from a large number of adsorbed atoms 212, the environment of a single adsorbed atom 212 may be determined. As described in an article by Pendry and the applicant in Surf. Sci. 145 33 (1984), the intensity of the DLEED pattern (i.e. the interference pattern between the object and reference waves) may be regarded as the incoherent superposition of the interference pattern from each adsorbate atom, due to the randomness of the location of the adsorbed atoms. However, because short range order exists for the adsorption sites, the wavelets that emerge from a each adsorbate atom 212, and its surrounding substrate atoms 210, are identical to the wavelets that emerge from the other adsorbate atoms 212, and their surrounding substrate atoms 210, apart from originating from a different location. The different origins may be treated simply as an origin-shift phase factor. If the wavelets emerging from different adsorbates are superposed to determine the total amplitude scattered in any particular direction, as they are at the detector, the adsorbed atoms 212, due to the randomness of the origin-shift phases, behave like a collection of incoherent scatterers, and the resulting DLEED pattern is the same as that from a single adsorbate, except for a uniform scaling factor. Thus, DLEED data generated by electrons scattered off many adsorbate atoms and may be interpreted as if the electrons were scattered off of a single adsorbed atom.

To create an actual holographic image, the hologram (film) must be illuminated by reconstructing coherent radiation, conjugate to the coherent radiation originally used to created the hologram. According to one aspect of the present invention, data corresponding to a holographic image is created by multiplying the data representing the intensity at each point by a function corresponding to the amplitude distribution of a reconstructing coherent electron beam. When a spherical detector is used, the reconstructing radiation of the reconstruction stage is a spherical wave having an amplitude distribution converging on the center of the sphere of which the detector is part, and has the form:

$$A_{rec} = (exp[-ik\hat{k}\cdot r])/r, \qquad (1)$$

where r is a position vector having an origin at the center of the sphere on which the detector is located, and $\hat{k}$ is the unit vector in the direction the incident radiation is propagating. In cartesian coordinates the expression is:

$$A_{rec} = exp[-ikz(1-\hat{k}_x^2-\hat{k}_y^2)^{\frac{1}{2}}]exp[-ik(x\hat{k}_x + y\hat{k}_y)](x^2+y^2+z^2)^{-\frac{1}{2}} \qquad (2)$$

where x and y are cartesian coordinates in the plane of the surface of crystal 104, z is the cartesian coordinate that is parallel to the surface normal, i.e., parallel to the electron paths 202A, 203A, 204A, 206A and 207A, $\hat{k}_z$ is the component of $\hat{k}$ in the x direction and $\hat{k}_y$ is the component of $\hat{k}$ in the y direction.

The amplitude of the holographic image at points off of the hologram may be calculated using the Helmholtz-Kirchoff integral. The Helmholtz-Kirchoff integral, applied to the reconstructed hologram is given by:

$$A(r) = \int\int I(k,\hat{k})exp[-ik\hat{k}\cdot r]d\hat{k}_x d\hat{k}_y \qquad (3)$$

where $I(k,\hat{k})$ is the DLEED intensity distribution, i.e. a function having a value at each point equal to the value of the data collected at that point. The applicant has found it preferable to use a non-linear scaling factor, as illustrated in the narrow boxes of FIGS. 2A, 3A and 3B, so that $I(k,\hat{k})$ has a value at each point equal to the value of the data collected multiplied by the non-linear scaling factor, in order to improve image clarity.

This integral may be solved numerically using a fast Fourier transform. $I(k,\hat{k})$, which is the intensity of the interference pattern between the object and reference waves, is equal to:

$$(R+O)(R^*+O) \text{ or } R^*R+O^*O+R^*O+O^*R, \qquad (4)$$

where R and R* represent the reference wave and its conjugate and O and O* represent the object wave and its conjugate. Both the reference and object waves are complex, as are all electron waves, according to quantum theory. The R*R term does not contain information about the interference of the reference and object waves, and the O*O term is negligible. Therefore, the integral of the amplitude of the hologram may be approximated by:

$$A(r) = \int\int [R^*O+O^*R]exp[-ikz(1-\hat{k}_x^2-\hat{k}_y^2)^{\frac{1}{2}}]exp[-ik(x\hat{k}_x+y\hat{k}_y)]d\hat{k}_x d\hat{k}_y \qquad (5)$$

As one skilled in the art will recognize, equation (5) is a double Fourier integral of the intensity distribution [R*O+O*R] multiplied by the phase factor exp[$-ikz(1-\hat{k}_x^2-\hat{k}_y^2)^{\frac{1}{2}}$], where exp[$-ik(x\hat{k}_x+y\hat{k}_y)$] is part of the Fourier transform, and may be solved on a personal computer or other microprocessor using a fast Fourier transform routine, such as one found in *Numerical Recipes*, William Press et. al., Cambridge Press (1986).

Figure 3A:
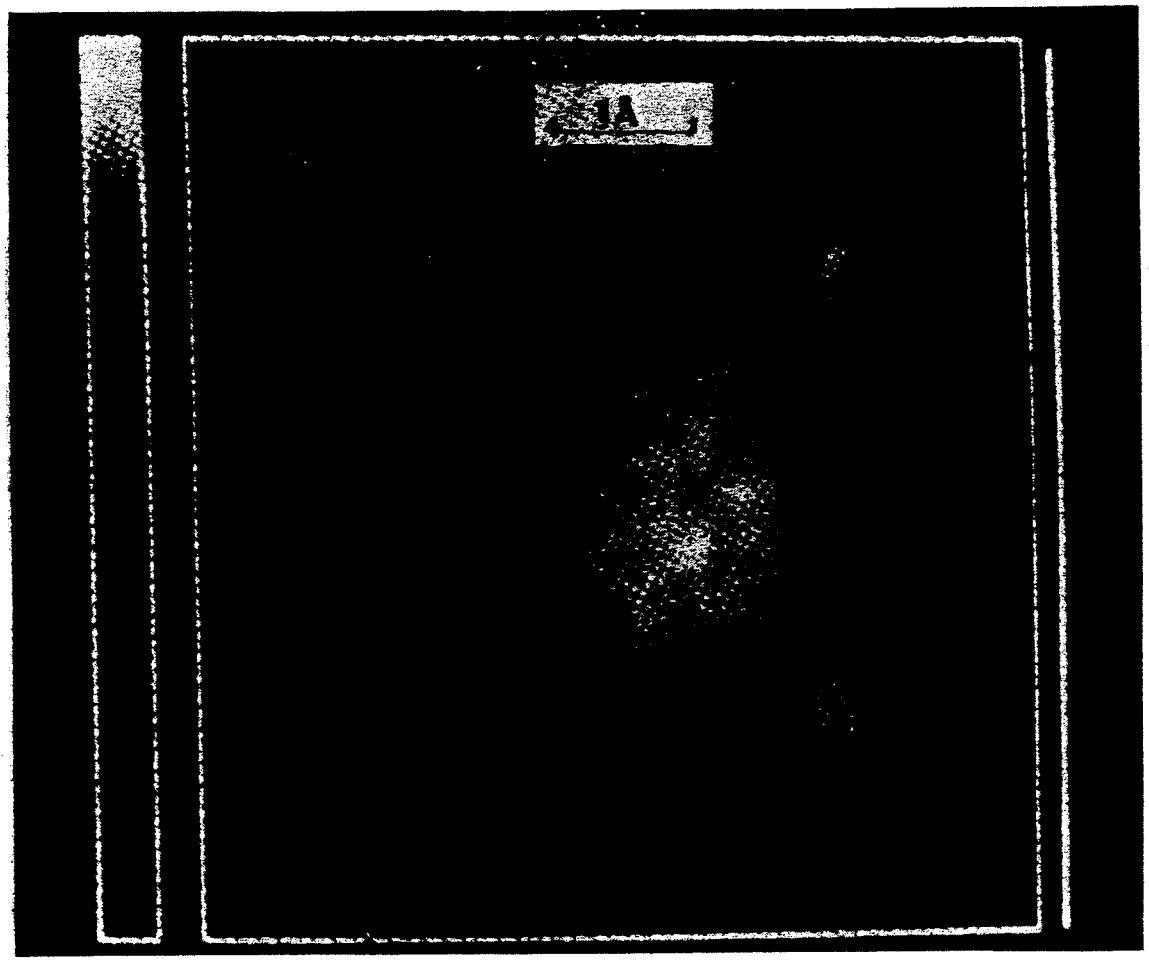
FIG. 3A is a photograph of a section of a first selected plane of a holographic image of an adsorbed atom surrounded by substrate atoms, generated, from the average of three computer generated DLEED patterns, each having a different electron energy, according to the present invention.
Figure 3B:
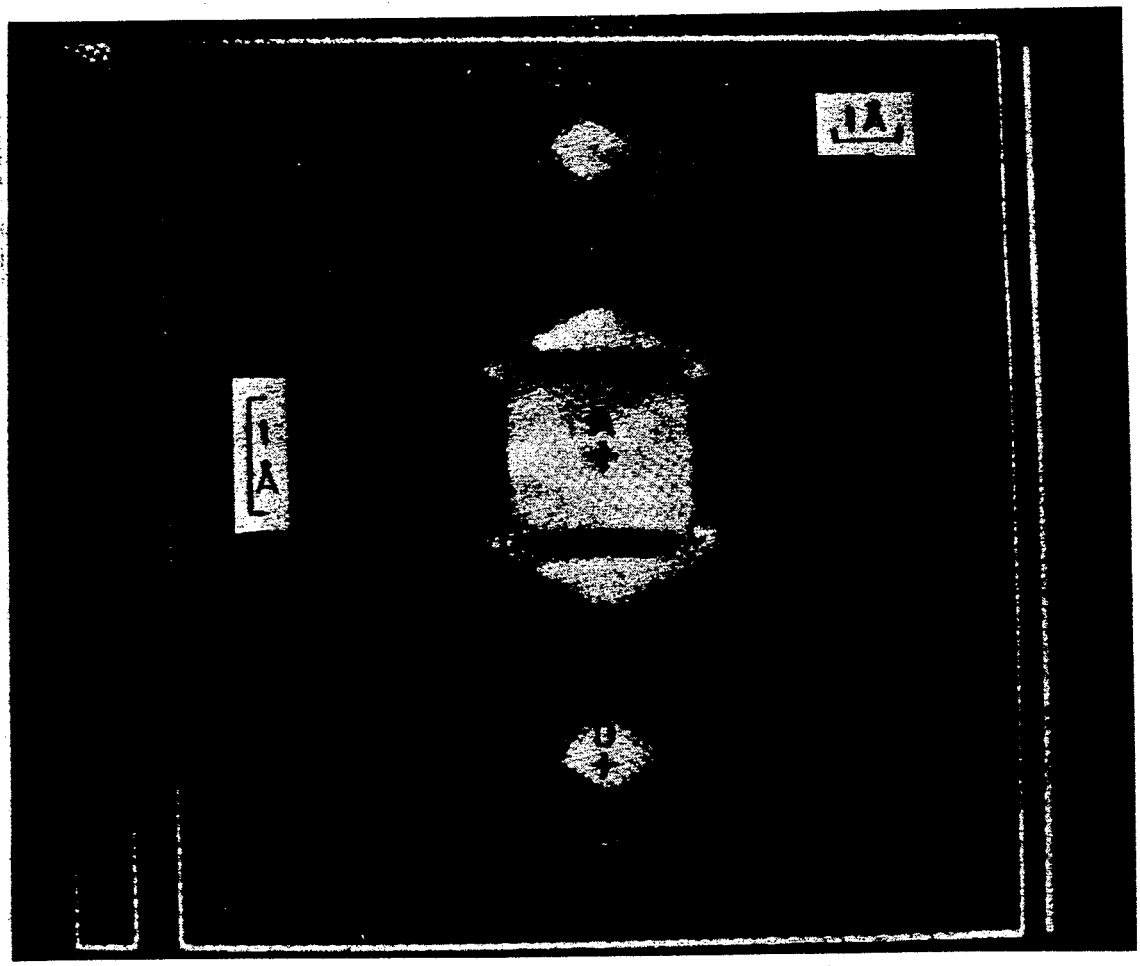
FIG. 3B is a photograph of a section of a second selected plane of a holographic image of an adsorbed atom surrounded by substrate atoms, generated, from the average of three computer generated DLEED patterns, each having a different electron energy, according to the present invention.

FIGS. 2A, 3A, and 3B are photographs showing selected planes of a holographic image of a crystal surface generated in accordance with the present invention. However, rather than physically generating the DLEED patterns (holograms) by diffracting electrons off of an unknown surface structure, the DLEED patterns (hologram) used to create the holographic image were generated according to a computer method set forth by the applicant and J. B. Pendry in Computer Physics Communication 42, 399 (1987). A DLEED pattern is generated, according to the computer method, by assuming the surface structure of a crystal, and providing that structure as an input to a computer program, along with the electron energy for which the DLEED pattern is to be generated. The computer program then calculates the intensity of the DLEED pattern that would be physically measured if electrons having the given energy were diffracted off of a crystal having the given surface structure. The photographs of FIGS. 2A, 3A, and 3B were made, according to the method of the present invention, by treating computer generated DLEED patterns as holograms, in the same manner that physically generated DLEED data is treated as a hologram, according to the present invention. Specifically, holographic image data was generated from computer generated DLEED patterns by mathematically illuminating the hologram and then calculating a reconstructed image intensity in three dimensions. The intensity in selected planes of the three dimensional image were then displayed on a computer, and the photographs of FIGS. 2A, 3A and 3B were made.

FIG. 2A shows the spatial distribution in the outermost atomic plane of the crystal surface generated according to the present invention, from a computer generated DLEED pattern. The DLEED pattern was generated using 435 eV electrons as an input, and assuming the surface structure was a disordered layer of oxygen atoms located in the hollow sites 0.9 angstroms above the topmost layer on a Ni(100) surface. The location A of the projection of adsorbed atom 212, and the locations B, C, E and F of the surrounding substrate atoms, which were used to generate the computer DLEED data, are denoted by + symbols. A strong central peak of the holographic image corresponds closely to the projection A of adsorbate atom 212, and a plurality of surrounding intensity maxima correspond closely to the locations B, C, E and F of substrate atoms 210.

The terms of equation (4) which were neglected in equation (5) will to give rise to random spurious features, which may be eliminated or reduced by repeating calculations for a variety of electron voltages. When the method is repeated for the O/Ni(100) surface, using energies of 424 and 462 eV, and the results are averaged, an improvement in image quality is observed, as shown in FIG. 3A.

From the holographic data used to generate FIG. 3A, a section of projection of the image in a second plane is shown in FIG. 3B, showing a high intensity spot near the location A of adsorbate atom 212, and a plurality of secondary high intensity areas near the expected locations B, C and D of nearby substrate atoms 210. The other high intensity areas are twin images created by the holographic process.

A further embodiment of the present invention is an apparatus for the reconstruction of a holographic image of disordered adsorbate atoms. Referring to FIGS. 1 and 2, the apparatus includes electron source 102, detector 106, camera 110, computer 112, and video display unit 114. Electron source 102, suitably an electron gun such as, for example a Varian Leed/Auger Model 981-2125, in the preferred exemplary embodiment, is capable of emitting substantially monochromatic electrons that are sufficiently collimated such that the electron beam may be considered coherent over distances on the order of 100 angstroms. The electrons emitted have energies suitably between about 20 and 500 electron volts, such that they generally penetrate, at most, two to three atomic layers of crystal 104.

The electrons emitted by electron source 102 impinge on the surface of crystal 104 and form a diffraction pattern at detector 106. Detector 106 is preferably spherical in shape such as, for example the 4-grid Leed optics Varian model 981-0127, and emits light having an intensity proportional to the intensity of the diffraction pattern at detector 106.

Camera 110 which may be, for example the Bosch T6YC 9A, records the intensity of the light emitted by detector 106, and provides as an output, an electrical signal corresponding to the light intensity. Thus, detector 106 and camera 110 cooperate to detect the intensity distribution of the diffraction pattern formed by the interference of reference and object waves, and provide an electrical signal corresponding to the detected intensity.

The output of camera 110 is provided to computer 112 which is capable of storing and manipulating the data. Specifically, computer 112, preferably a relatively inexpensive personal computer such as, for example an IBM PC/AT, or other microprocessor, is capable of multiplying each data point of the detected intensity distribution by a function corresponding to the intensity of an illuminating wave and a phase factor from equation (5), to thereby generate a reconstructed holographic image.

Computer 112 is further capable of generating 1 holographic image intensity data in three dimensions, by applying a fast Fourier transform, or other similar mathematical technique, to the reconstructed holographic image data. Image intensity data corresponding to a specific plane is then provided by computer 112 to video display unit monitor 114, printer or similar device to allow the surface of the crystal, in the specific plane to be viewed.

It should be clear from the foregoing specification that modifications and changes may be made to the invention without departing from the scope of the claims.

We claim:

1. A method for imaging of the atomic environment of the surface of a sample, including the steps of:
    (a) directing a beam of electrons against said surface to form an interference pattern resulting from the interference of waves emanating from said surface when the beam of electrons is directed against said surface;
    (b) detecting the intensity distribution of said pattern;
    (c) calculating numerical image intensity data corresponding to said intensity distribution; and
    (d) reconstructing the data to form an image indicating the location of a scatterer atom on said surface relative to an associated emitter atom on said surface.

2. The method of claim 1, wherein steps (a)–(d) are conducted continuously, and step (d) further comprises displaying a real-time image of said sample.

3. The method of claim 2, wherein said beam is a low energy electron beam comprising electrons of an energy of about 20 to 500 eV.

4. The method of claim 3, wherein said reconstructed data comprises a reconstructed image intensity in three dimensions, and step (d) further comprises selecting a plane within said reconstructed data and displaying a two-dimensional image of said plane on a video display.

5. A method of three dimensional imaging of the atomic environment of a sample surface, comprising the steps of:
    (a) forming a diffuse low energy electron diffraction pattern resulting from the interference of waves emanating from said surface when a beam of low energy electrons is directed against said surface;
    (b) detecting the intensity distribution of said pattern and generating first data corresponding to said intensity distribution;
    (c) generating second data corresponding to reconstructed amplitudes of a wave form by operation upon said first data by a function representing a reconstruction reference wave; and
    (d) generating third data corresponding to an integral of said second data and capable of being displayed as two-dimensional sections through a three-dimensional image of an atom at the surface of said sample.

6. The method of claim 5, in which said third data is generated by applying a fast Fourier transform to said second data.

7. The method of claim 6, in which said reconstruction reference wave is a converging spherical wave represented by $(\exp[-ikr])/r$, where k is the electron's wave number, and r is a radial coordinate.

8. The method of claim 5, in which said low energy electron beam has electrons of an energy of about 300 eV to 500 eV.

9. The method of claim 5, further comprising repeating steps (a) through (d) at a different electron energy level for said beam, then averaging said third data corresponding to each different electron energy level.

10. The method of claim 5, further comprising a step (e) of displaying said third data to form an image of an atom without using a lens.

11. The method of claim 5, wherein said surface is a crystal surface having adsorbed atoms different from atoms of said crystal on the surface thereof, and step (a) further comprises directing a beam of electrons against said surface to cause said adsorbate atoms to split said beam into a reference wave comprising electrons which scatter last off of adsorbed atoms, and an object wave comprising electrons which scatter last off of atoms of said crystal after backscattering from one of said adsorbed atoms, said pattern being a diffraction pattern formed by interference between said reference and object waves.

12. The method of claim 11, wherein step (a) further comprises adding adsorbate atoms to the crystal surface.

13. The method of claim 12, in which electrons in said beam have an energy of about 300 eV to 500 eV.

14. The method of claim 5, wherein step (b) further comprises detecting said intensity distribution with a detector screen and recording said intensity distribution with a camera.

15. The method of claim 5, wherein step (c) further comprises multiplying each of said second data by a function representing a converging spherical wave form and a phase factor.

16. An apparatus for imaging of the atomic environment of the surface of a sample, comprising:
   means for directing a beam of electrons against said surface to form an interference pattern resulting from the interference of waves emanating from said surface when the beam of electrons is directed against said surface;
   means for detecting the intensity distribution of said pattern;
   means for calculating numerical image intensity data corresponding to said intensity distribution; and
   means for reconstructing the data to form a real-time image indicating the location of a scatterer atom on said surface relative to an associated emitter atom on said surface.

17. An apparatus for imaging of the atomic environment of the surface of a sample, comprising:
   an electron beam generator for forming a diffuse low energy electron diffraction pattern resulting from the interference of waves emanating from said surface when a beam of low energy electrons is directed against said surface;
   a detector for detecting the intensity distribution of said pattern;
   a camera for recording said intensity distribution and generating a first electrical signal comprising first data corresponding to said intensity distribution;
   a computer for receiving said first electrical signal and storing said first data, including a computer program for generating second data from said first data, said second data corresponding to reconstructed amplitudes of a wave form by operation upon said first data by a function representing a reconstruction reference wave, and for generating third data corresponding to an integral of said second data and capable of being displayed as two-dimensional sections through a three-dimensional image of an atom at the surface of said sample, said computer further comprising means for converting said third data into a second electrical signal; and
   an output device connected to receive said second electrical signal from said computer and display said third data as a real-time image of said sample.

18. The apparatus of claim 17, wherein said output device comprises a video display for displaying a real-time image of an atom at the surface of said sample relative to adjoining atoms.

19. The apparatus of claim 17, wherein said detector is spherical and said program includes means for multiplying said first data by a function representing a converging spherical wave and a phase factor, and wherein said program further includes means for performing a fast Fourier transform on said second data.

20. The apparatus of claim 17, wherein said beam generator can generate an electron beam having electrons of an energy of about 300 eV to 500 eV.

* * * * *